United States Patent
Yi et al.

(10) Patent No.: US 6,686,240 B2
(45) Date of Patent: Feb. 3, 2004

(54) SEMICONDUCTOR MEMORY DEVICE HAVING A MULTIPLE TUNNEL JUNCTION LAYER PATTERN AND METHOD OF FABRICATING THE SAME

(75) Inventors: Ji-Hye Yi, Kyunggi-do (KR); Woo-Sik Kim, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/394,030

(22) Filed: Mar. 24, 2003

(65) Prior Publication Data

US 2003/0168693 A1 Sep. 11, 2003

Related U.S. Application Data

(62) Division of application No. 10/146,897, filed on May 17, 2002.

(30) Foreign Application Priority Data

Aug. 8, 2001 (KR) .......................................... 2001-47666

(51) Int. Cl.[7] .......................................... H01L 21/8242
(52) U.S. Cl. ........................ 438/253; 438/254; 438/266; 438/397
(58) Field of Search .................................. 438/253, 254, 438/261, 264, 266, 267, 346, 397, 398

(56) References Cited

U.S. PATENT DOCUMENTS

| | | | | |
|---|---|---|---|---|
| 5,952,692 A | | 9/1999 | Nakazato et al. | 257/321 |
| 6,060,723 A | * | 5/2000 | Nakazato et al. | 257/28 |
| 6,211,531 B1 | * | 4/2001 | Nakazato et al. | 257/28 |
| 6,381,171 B1 | * | 4/2002 | Inomata et al. | 365/173 |
| 6,407,423 B1 | | 6/2002 | Okumoto | 257/306 |
| 6,475,857 B1 | * | 11/2002 | Kim et al. | 438/240 |
| 6,528,896 B2 | * | 3/2003 | Song et al. | 257/327 |
| 6,549,454 B1 | * | 4/2003 | Slaughter | 365/158 |

* cited by examiner

Primary Examiner—Kevin M. Picardat
(74) Attorney, Agent, or Firm—Lee & Sterba, P.C.

(57) ABSTRACT

A semiconductor memory device and fabricating method thereof, wherein the semiconductor memory device includes first and second conductive regions formed in parallel at predetermined regions of a semiconductor substrate, a storage node and a multiple tunnel junction layer pattern sequentially stacked on a channel region between the first and second conductive regions, a data line stacked on the multiple tunnel junction layer pattern, and a wordline covering both sidewalls of the storage node and of the multiple tunnel junction layer pattern, wherein both sidewalls of the storage node have undercut regions for increasing the overlapping area of the storage node and a wordline. The storage node is formed by alternately and repeatedly stacking first and second conductive layers having different etch rates, successively patterning the conductive layers to form a storage node pattern, and selectively and isotropically etching the first or second conductive layer of the storage node pattern.

15 Claims, 14 Drawing Sheets

SEMICONDUCTOR MEMORY DEVICE HAVING A MULTIPLE TUNNEL JUNCTION LAYER PATTERN AND METHOD OF FABRICATING THE SAME

This application is a DIVISION of application Ser. No. 10/146,897, filed May 17, 2002.

BACKGROUND OF THE INVENTION

1. Field of the Invention

The present invention generally relates to a semiconductor device and a method of fabricating the same. More specifically, the present invention is directed to a semiconductor memory device having a multiple tunnel junction layer pattern and a method of fabricating the same.

2. Description of the Related Art

An advantage of a dynamic random access memory (DRAM) device is a higher integration density than other memory devices, such as a static random access memory (SRAM). However, in case of the DRAM, a periodic refresh is necessary to retain data stored in the memory cell. Therefore, electric power is consumed even when the device is in a stand-by mode. Alternatively, in a case of a non-volatile memory device, such as a flash memory device, the refresh operation for the stored data is basically unnecessary. Unfortunately, a non-volatile memory device requires a high voltage to program or erase memory cells.

FIG. 1 illustrates a cross-sectional view of a conventional semiconductor memory device having a multiple tunnel junction layer pattern.

Referring now to FIG. 1, a unit cell of a semiconductor memory device includes a planar transistor and a vertical transistor. The planar transistor includes a drain region 17d and a source region 17s, which are separately formed in predetermined regions of a semiconductor substrate 1, and a floating gate 5 located over a channel region between the drain region 17d and the source region 17s. The drain region 17d and the floating gate 5 correspond to a bitline and a storage node, respectively. A gate insulating layer 3 is interposed between the storage node (i.e., the floating gate) 5 and the channel region.

A multiple tunnel junction layer pattern 12 and a data line 13 are sequentially stacked on the storage node 5. The multiple tunnel junction layer pattern 12 includes semiconductor layers 7 and tunnel insulating layers 9 that are alternately and repeatedly stacked. A top layer 11 of the multiple tunnel junction layer pattern 12 may be a semiconductor layer 7 or a tunnel insulating layer 9. The data line 13 is extended for electrically connecting a plurality of adjacent memory cells. The storage node 5, the multiple tunnel junction layer pattern 12, and the data line 13 constitute a multi-layered pattern 15.

A sidewall and a top surface of the multi-layered pattern 15 are covered with an inter-gate insulating film 19. A wordline 21 is formed on the inter-gate insulating film 19 across the data line 13. The wordline 21 is formed to overlap the multi-layered pattern 15. The data line 13, the multiple tunnel junction layer pattern 12, the storage node 5, the inter-gate insulating film 19, and the wordline 21 constitute the vertical transistor.

In the above-described conventional semiconductor memory device, an overlapping area between the storage node and the wordline is directly related to the thickness of the storage node. The overlapping area has an influence upon the coupling ratio of the unit cell. That is, an increase in the overlapping area leads to an increase in the coupling ratio. Thus, it is necessary to increase the overlapping area between the storage node and the wordline in order to reduce a read voltage applied to the wordline in a read mode. However, if the thickness of the storage node is increased for increasing the overlapping area, the height of the unit cell is increased, which results in a difficulty in performing a subsequent patterning process.

SUMMARY OF THE INVENTION

A primary features of an embodiment of the present invention provides a semiconductor memory device having a high coupling ratio without an increase in the height of a unit cell.

Another feature of an embodiment of the present invention provides a semiconductor memory device that achieves an excellent read operation with a low read voltage.

Still another feature of an embodiment of the present invention provides a method of fabricating a semiconductor memory device that may increase a coupling ratio within a limited height of a unit cell.

Yet another feature of an embodiment of the present invention provides a method of fabricating a semiconductor memory device that may reduce the read voltage.

These and other features of the present invention are accomplished by a semiconductor memory device having a multiple tunnel junction layer pattern and a fabricating method thereof. A unit cell of the semiconductor memory device includes a planar transistor and a vertical transistor. The planar transistor includes first and second conductive regions formed in parallel at predetermined regions of a semiconductor substrate, and a storage node formed on a channel region between the first and second conductive regions. A gate insulating layer pattern may be interposed between the storage node and the substrate. The vertical transistor includes the storage node, a multiple tunnel junction layer pattern stacked on the storage node, a data line disposed on the multiple tunnel junction layer pattern and parallel to the first and second conductive regions, and a wordline crossing over the data line and covering both sidewalls of the storage node and both sidewalls of the multiple tunnel junction layer pattern. An inter-gate insulating film may be interposed between the wordline and sidewalls of the storage node, and between the wordline and sidewalls of the multiple tunnel junction layer pattern. Both sidewalls of the storage node include an undercut region for maximizing a overlapping area between the storage node and the wordline.

The semiconductor memory device according to an embodiment of the present invention may also include a plurality of parallel conductive regions formed on a semiconductor substrate, a plurality of storage nodes having undercut sidewalls, trench regions formed in the semiconductor substrate between the storage nodes arranged on a line parallel to the conductive regions, a plurality of multiple tunnel junction layer patterns, device isolation layer patterns filling the trench regions, a plurality of data lines covering the multiple tunnel junction layer patterns and the device isolation layer patterns therebetween on a line parallel to the conductive regions, and a plurality of parallel wordlines.

To maximize the overlapping area between a wordline and a storage node, the storage node is formed by alternately and repeatedly stacking first and second conductive layer patterns. The width of all first conductive layer patterns in the stack, in a direction parallel to the wordline direction is smaller than the width of all second conductive layer patterns and the width of the multiple tunnel junction layer pattern.

The storage node acts as a source region of the vertical transistor, as well as a gate electrode of the planar transistor. This makes it possible to maximize a capacitance between the storage node and the wordline within a limited height of the storage node. In other words, a coupling ratio of the unit cell may be maximized. This feature results in a decrease in read voltage applied to the wordline in a read mode.

A method of fabricating a semiconductor memory device according to an embodiment of the present invention includes forming a gate insulating layer pattern, a storage node pattern, a multiple tunnel junction layer pattern, an upper conductive layer pattern, and a data line that are sequentially stacked on a predetermined region of a semiconductor substrate. The data line is extended in one direction. The storage node pattern is formed by alternately and repeatedly stacking at least two conductive layers having different etch rates. The storage node pattern is etched to form a storage node having a sidewall with an undercut region. Thus, a sidewall area of the storage node is maximized. An inter-gate insulating film may be conformally formed on an entire surface of a semiconductor substrate having the storage node. A wordline is formed on the inter-gate insulating film, if present, across the data line. The wordline covers both sidewalls of the storage node and both sidewalls of the multiple tunnel junction layer pattern. As a result, an overlapping area between the wordline and the storage node may be maximized due to the undercut region. Following formation of the storage node, an impurity region may be formed in a semiconductor substrate that is positioned at both sides of the storage node.

In an embodiment of the present invention, a method of fabricating a semiconductor memory device includes: forming a plurality of trench regions 2-dimensionally arranged along row and column directions at predetermined regions of a semiconductor substrate to define a mesh-shaped active region, as well as a gate insulating layer, a storage node layer, a multiple tunnel junction layer, and an upper conductive layer, which are sequentially stacked on the mesh-shaped active region, wherein the storage node layer is formed by sequentially stacking at least two conductive layers having different etch rates; forming a plurality of island-shaped device isolation layer patterns filling the trench regions; forming an interconnection layer covering the upper conductive layer and the device isolation layer patterns; successively patterning the interconnection layer, the upper conductive layer, the multiple tunnel junction layer, the storage node layer, and the gate insulating layer to form a plurality of data lines which are parallel to the column direction, as well as a gate insulating layer pattern, a storage node pattern, a multiple tunnel junction layer pattern, and an upper conductive layer pattern which are sequentially stacked in regions between the device isolation layers under each of the data lines; etching the storage node patterns to form storage nodes having undercut regions at both sidewalls of the storage node patterns; conformally forming an inter-gate insulating film on an entire surface of a resultant structure having the storage nodes; and forming a plurality of parallel wordlines crossing over the data lines on the inter-gate insulating film, each of the wordlines covering both sidewalls of the storage nodes and both sidewalls of the multiple tunnel junction layer patterns.

In an embodiment of the present invention the storage node layer is formed by alternately and repeatedly stacking first and second conductive layers, wherein an etch rate of the first conductive layer is higher than an etch rate of the second conductive layer. In an embodiment of the present invention, the method of fabricating a semiconductor memory device, may further include, after forming the storage nodes, implanting impurities into the active region between the data lines to form a plurality of conductive regions parallel to the data lines.

In an embodiments of the present invention, a method of forming the storage node layer of a semiconductor memory device includes sequentially stacking a first conductive layer pattern, a second conductive layer pattern, and a third conductive layer pattern, wherein an etch rate of the second conductive layer is higher than the etch rates of the first and third conductive layers.

These and other features of the present invention will be readily apparent to those of ordinary skill in the art upon review of the detailed description that follows.

BRIEF DESCRIPTION OF THE DRAWINGS

Preferred embodiments of the present invention are described below with reference to the following accompanying drawings, in which:

FIGS. 5A through 10A illustrate cross-sectional views for explaining a method of fabricating a semiconductor memory device according to an embodiment of the present invention, taken along line I—I of FIG. 2; and FIGS. 5B through 10B illustrate cross-sectional views for explaining a method of fabricating a semiconductor memory device according to an embodiment of the present invention, taken along line II—II of FIG. 2.

DETAILED DESCRIPTION OF THE INVENTION

Figure 1:
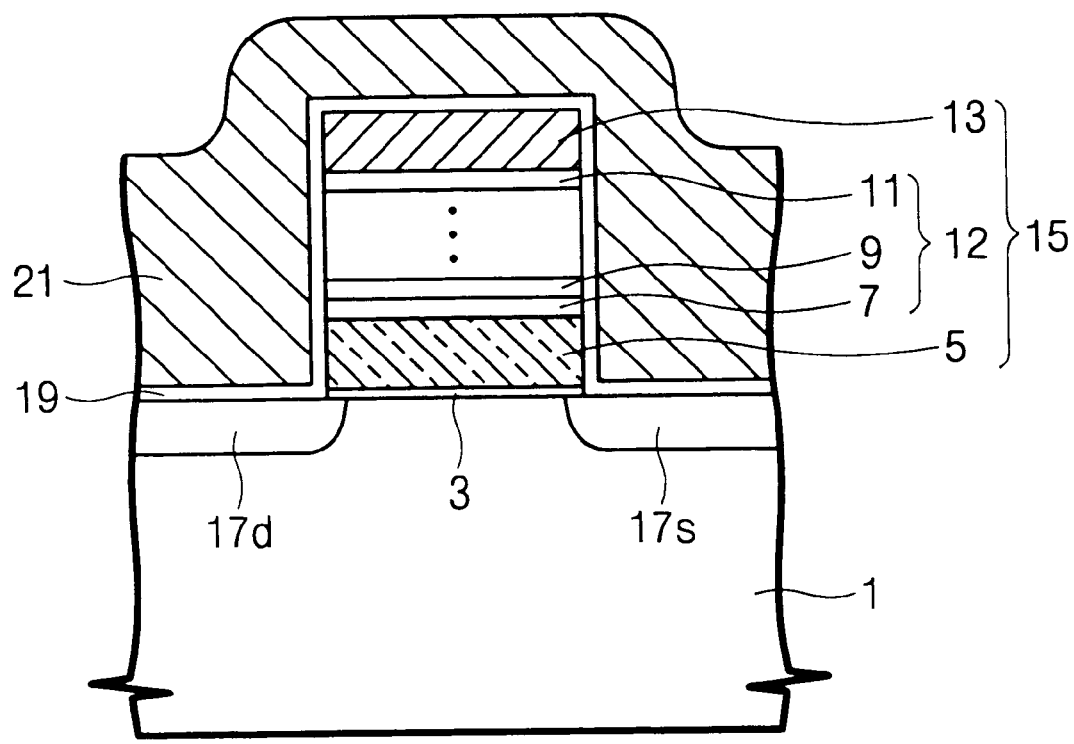
FIG. 1 illustrates a cross-sectional view of a conventional semiconductor memory device according to the prior art.

Korean Patent Application No. 2001-47666, filed on Aug. 8, 2001, and entitled "Semiconductor Memory Device Having Multiple Tunnel Junction Layer Pattern and Method of Fabricating the Same," is incorporated by reference herein in its entirety.

The present invention will now be described more fully hereinafter with reference to the accompanying drawings, in which preferred embodiments of the present invention are shown. The present invention may, however, be embodied in different forms and should not be construed as limited to the embodiments set forth herein. Rather, these embodiments are provided so that this disclosure will be thorough and complete, and will fully convey the scope of the present invention to those of ordinary skill in the art. In the drawings, the thickness of layers and regions are exaggerated for clarity. It will also be understood that when a layer is referred to as being "on" or "above" another layer or substrate, it may be directly on the other layer or substrate, or intervening layers may also be present. Similarly, when a layer is referred to as being "below" or "under" another layer, it may be directly under the other layer or intervening layers may also be present. When a layer is described as being "between" two layers, it may be directly between the two layers or some other intervening layers may also be present. Like numbers refer to like elements throughout.

Figure 2:
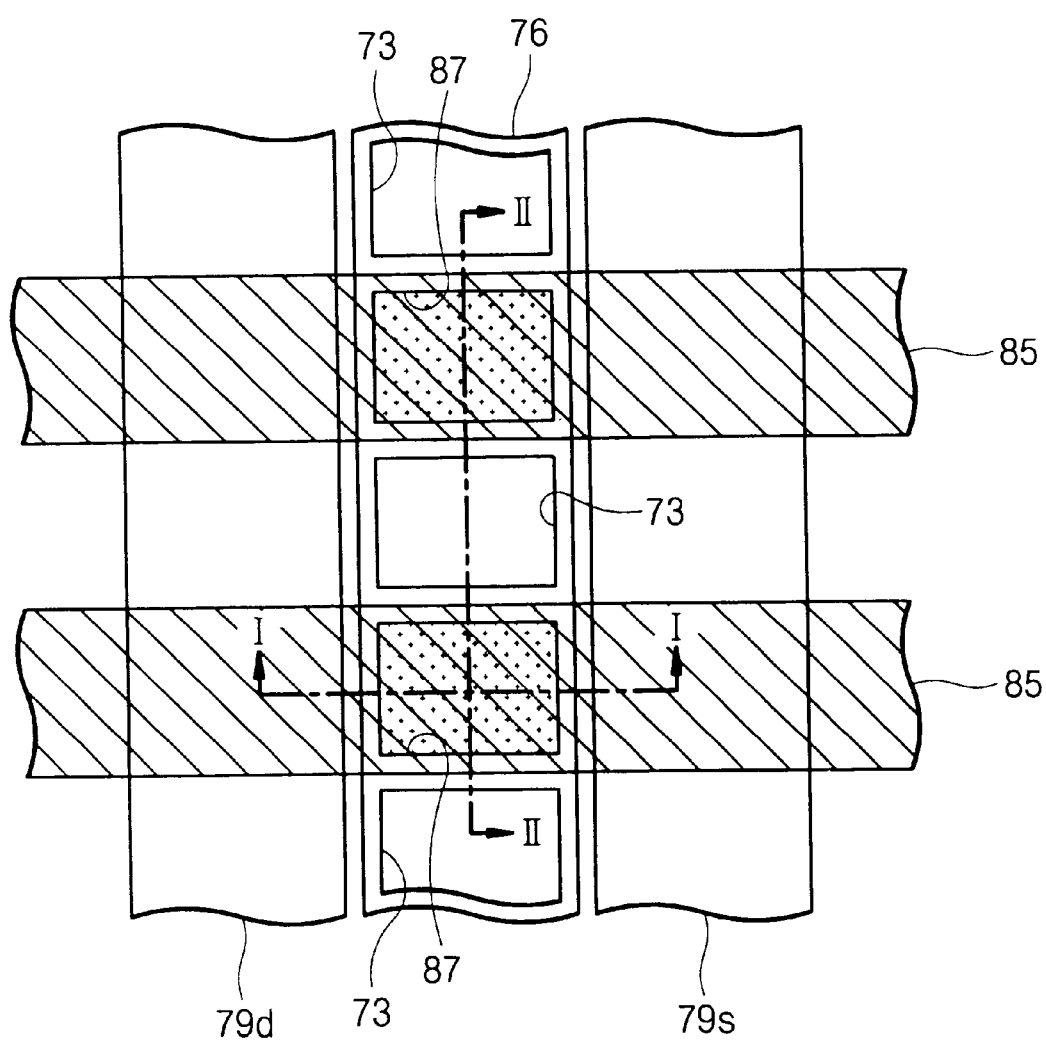
FIG. 2 illustrates a top plan view of a typical semiconductor memory device.
Figure 3A:
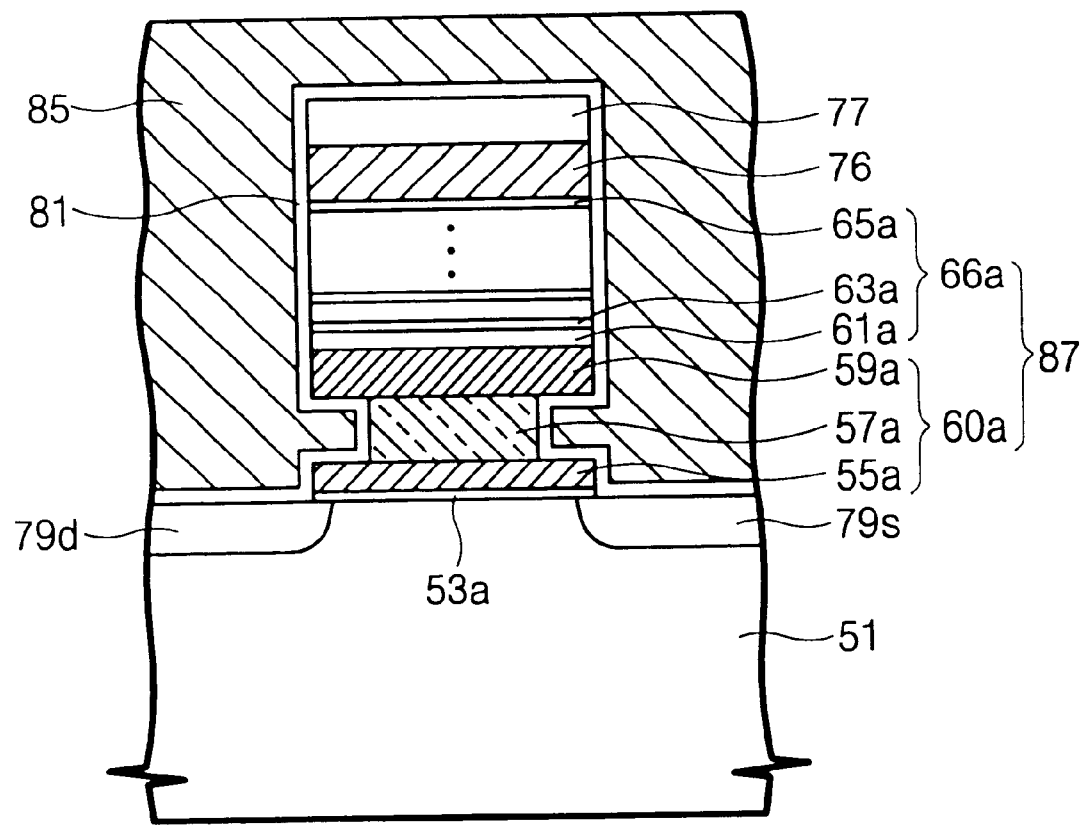
FIG. 3A illustrates a cross-sectional view of a semiconductor memory device according to an embodiment of the present invention, taken along line I—I of FIG. 2.
Figure 3B:
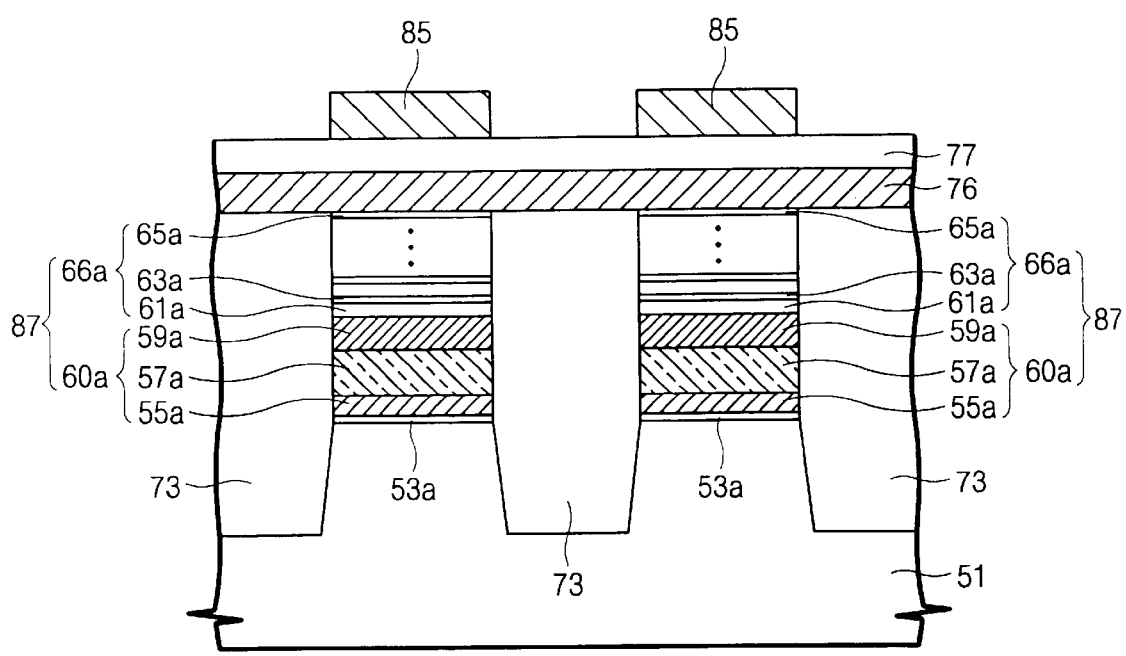
FIG. 3B illustrates a cross-sectional view of a semiconductor memory device according to an embodiment of the present invention, taken along line II—II of FIG. 2.

Referring now to FIGS. 2, 3A and 3B, first and second conductive regions 79d and 79s are disposed at predetermined regions of a semiconductor substrate 51 in parallel. The first and second conductive regions 79d and 79s are formed parallel in one direction, i.e., a column direction. The first conductive region 79d acts as a bitline and is connected to a sense amplifier (not shown). A plurality of multi-layered patterns 87 are disposed on the substrate 51, between the first and second conductive regions 79d and 79s, along the column direction. Regions between the multi-layered patterns 87 are filled with a device isolation layer pattern 73 that are extended into the substrate 51 to completely isolate the adjacent multi-layered patterns 87 from each other. Each of the multi-layered patterns 87 includes a storage node 60a and a multiple tunnel junction layer pattern 66a that are sequentially stacked on the substrate 51.

The storage node 60a includes both sidewalls having undercut regions in its cross-sectional view along line I—I of FIG. 2, i.e. in a direction parallel to a row direction, including the location where a word line 85 crosses a data line 76. More specifically, the storage node 60a includes a first conductive layer pattern 55a, a second conductive layer pattern 57a, and a third conductive layer pattern 59a that are sequentially stacked on the substrate 51. The width of the second conductive layer pattern 57a is smaller than the widths of the first and third conductive layer patterns 55a and 59a so that the sidewall area of the storage node 60a has a maximized area within a limited height of the storage node 60a.

Alternatively, the storage node 60a may comprise only the first and second conductive layer patterns 55a and 57a. In this case, the width of the second conductive layer pattern 57a is smaller than the widths of the first conductive layer pattern 55a and the multiple tunnel junction layer pattern 66a.

The multiple tunnel junction layer pattern 66a includes semiconductor layer patterns 61a and tunnel insulating layer patterns 63a that are alternately and repeatedly stacked. The top most layer 65a of the multiple tunnel junction layer pattern 66a may be a tunnel insulating layer pattern 63a or a semiconductor layer pattern 61a.

A data line 76 is disposed on the multiple tunnel junction layer patterns 66a and the device isolation layer pattern 73 therebetween. Thus, in the top view plan, the data line 76 is located between the first and second conductive regions 79d and 79s. A capping insulating layer pattern 77 may be disposed on the data line 76. A plurality of wordlines 85 are arranged to cross over the data line 76. Each of the wordlines covers both sidewalls of the storage node 60a and both sidewalls of the multiple tunnel junction layer pattern 66a. An inter-gate insulating film 81 is conformally interposed between the wordlines 85 and the sidewalls of the storage nodes 60a, and the multiple tunnel junction layer patterns 66a.

Another embodiment of the present invention is described with reference to FIGS. 4A and 4B. A difference between this embodiment and the other embodiments is the shape of the storage node 60a. Accordingly, in regard to this embodiment of the present invention, only the storage node 60a will be described in detail.

Figure 4A:
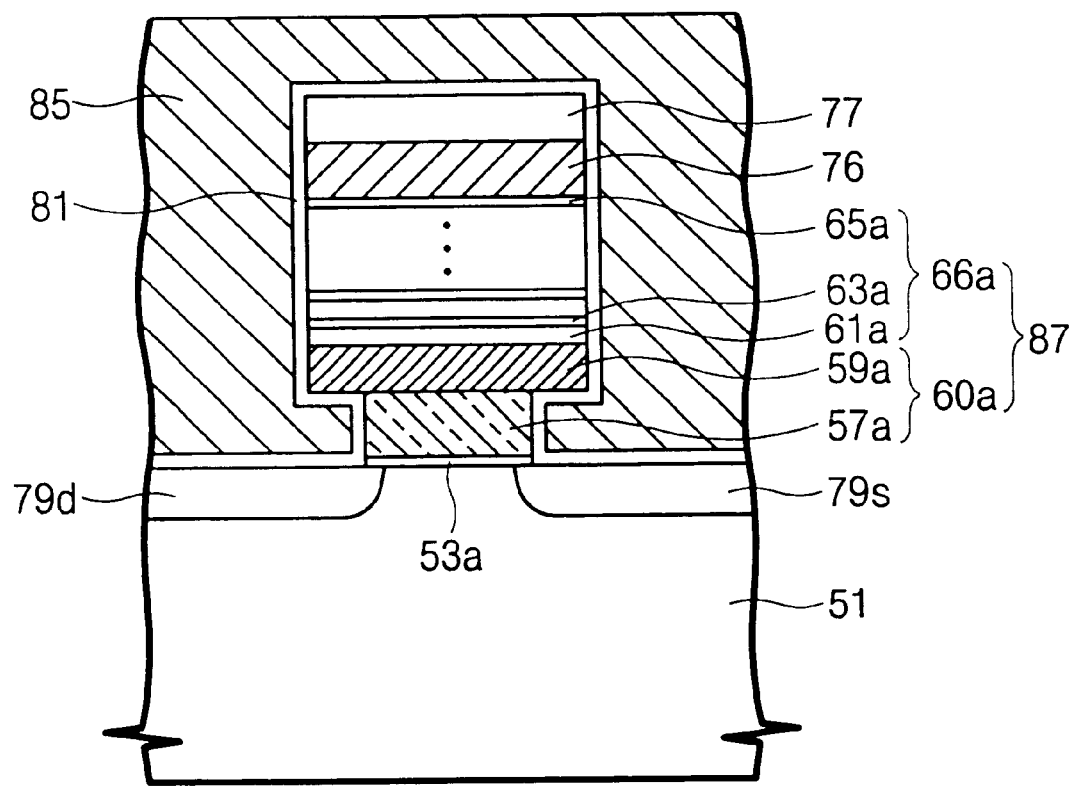
FIG. 4A illustrates a cross-sectional view of a semiconductor memory device according to an another embodiment of the present invention, taken along line I—I of FIG. 2.
Figure 4B:
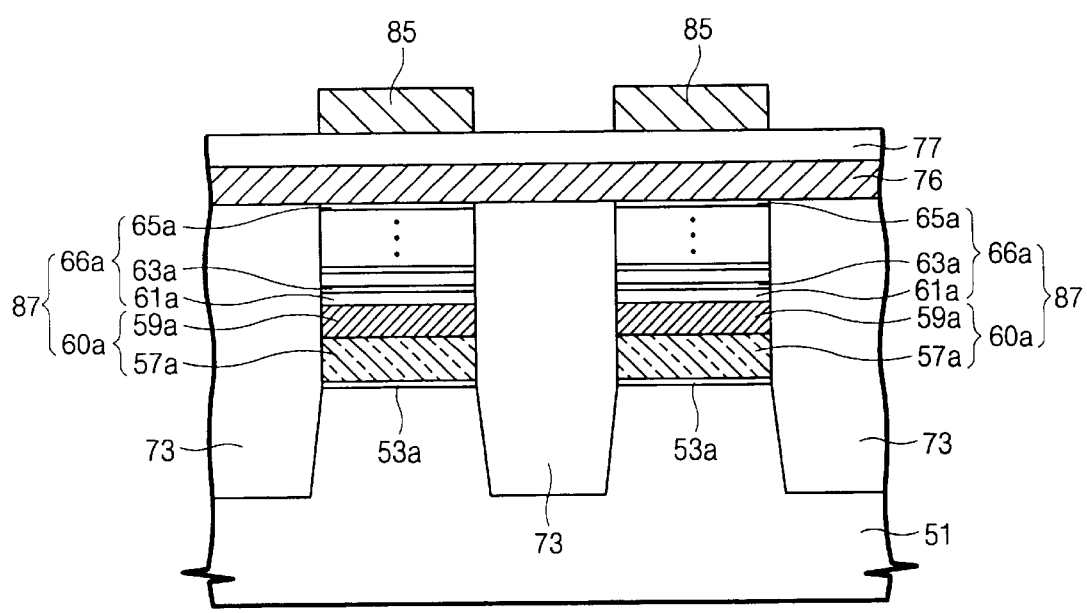
FIG. 4B illustrates a cross-sectional view of a semiconductor memory device according to an another embodiment of the present invention, taken along line II—II of FIG. 2.

Referring now to FIGS. 4A and 4B, the storage node 60a includes only the second and the third conductive layer patterns 57a and 59a. In this embodiment, the device structure is such that both edges of the second conductive layer pattern 57a overlap with the first and second conductive regions 79d and 79s.

A method of driving a cell of the foregoing semiconductor memory device will be described briefly.

In a write mode, a data voltage is applied to the data line 76 and a write voltage is applied to the wordline 85. Accordingly, an inverted channel is formed at sidewalls of the semiconductor layers 61a and a tunneling current flows through the tunnel insulating layers 63a. As a result, electrons or holes are stored in the storage node 60a depending upon the voltage applied to the data line 76. These stored charges vary a threshold voltage of the planar transistor.

In order to read out information stored in the storage node, a read voltage is applied to the wordline and a suitable voltage, e.g., a ground voltage, is applied to the second conductive region 79s. If the threshold voltage of the planar transistor is higher than the read voltage, the planar transistor is turned off to prevent a current from flowing through the first conductive region 79d. Alternatively, if the threshold voltage of the planar transistor is lower than the read voltage, the planar transistor is turned on to enable a current to flow through the first conductive region 79d. An increase in an overlapping area between the storage node 60a and the wordline 85 allows a voltage induced in the storage node to approach the read voltage applied to the wordline 85. As a result, the read voltage may be reduced.

Thus, according to the above-described embodiments, a capacitance between a storage node and a wordline is maximized to reduce a read voltage.

Figure 5A:
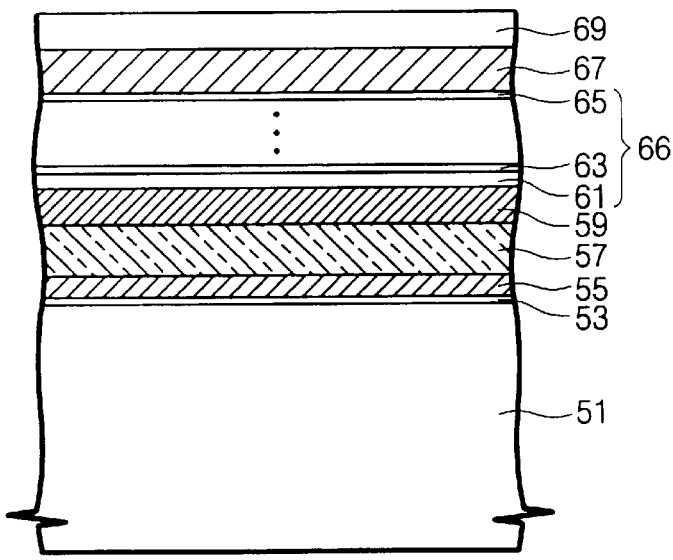
Figure 5B:
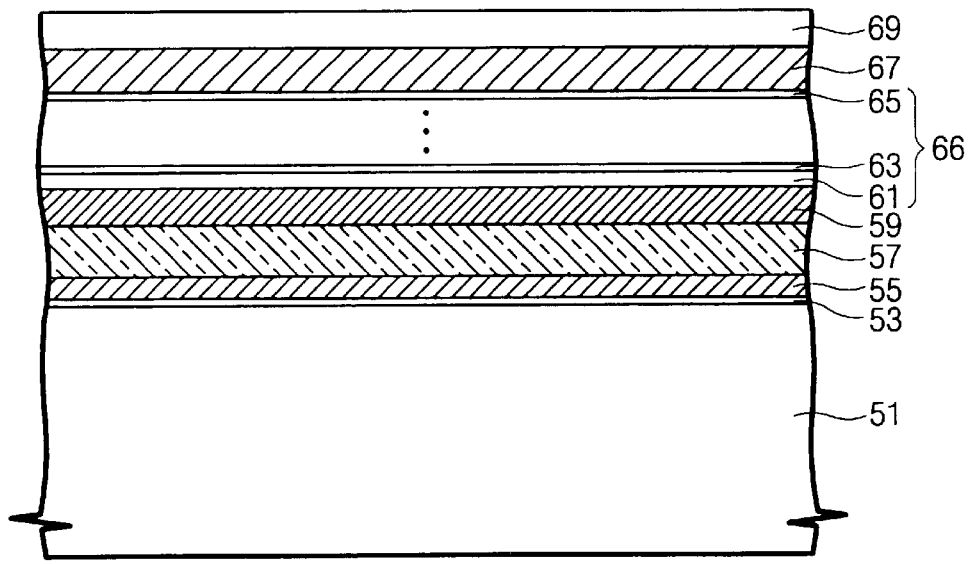

Referring now to FIGS. 5A and 5B, a gate insulating layer 53, a storage node layer, a multiple tunnel junction layer 66, an upper conductive layer 67, and a chemical mechanical polishing (CMP) barrier layer 69 are sequentially formed on a semiconductor substrate 51. The storage node layer is formed by stacking at least two conductive layers having different etch rates. In this embodiment, the storage node layer is formed by sequentially stacking the first to third conductive layers 55, 57, and 59. An etch rate of the second conductive layer 57 is higher than etch rates of the first and third conductive layers 55 and 59. More specifically, the first and third conductive layers 55 and 59 are preferably made of a silicon layer and the second conductive layer 57 is preferably made of a silicon germanium (SiGe) layer. Alternatively, the storage node layer may be formed by sequentially stacking the first and second conductive layers 55 and 57 or sequentially stacking the second and third conductive layers 57 and 59.

The multiple tunnel junction layer 66 is formed by alternately and repeatedly stacking a semiconductor layer 61 and a tunnel insulating layer 63. The semiconductor layer 61 may be made of silicon, and the tunnel insulating layer 63 may be made of silicon nitride, silicon oxynitride or silicon oxide. The top most layer 65 of the multiple tunnel junction layer 66 may be the semiconductor layer 61 or the tunnel insulating layer 63. The upper conductive layer 67 is preferably made of doped silicon. The CMP barrier layer 69 is preferably made of silicon nitride.

Figure 6A:
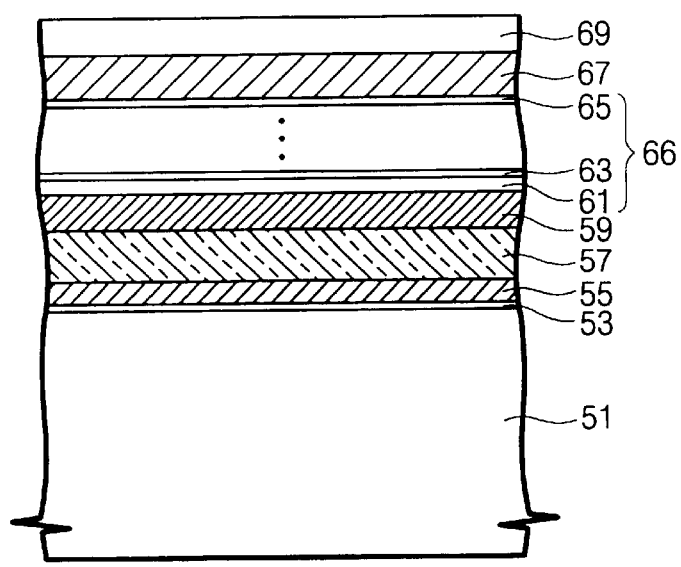
Figure 6B:
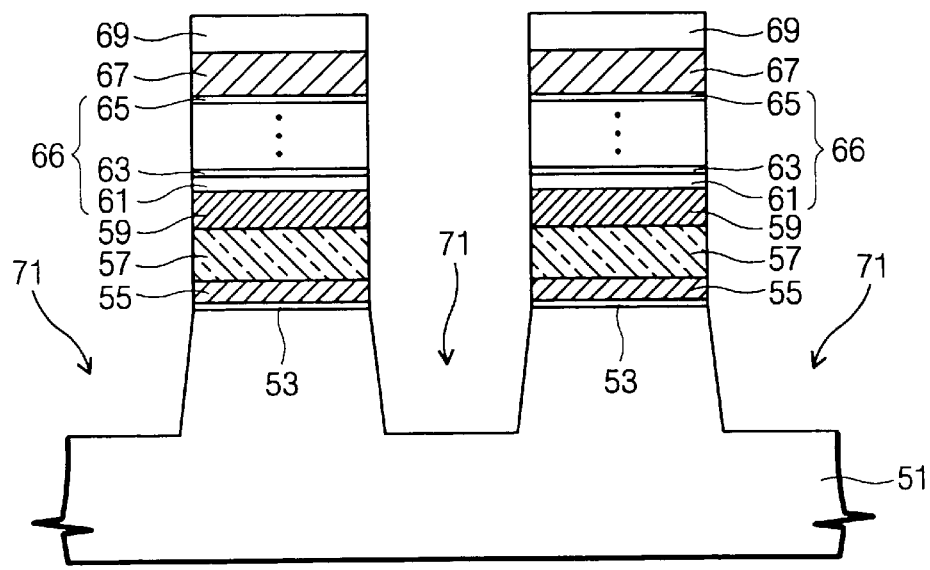

Referring now to FIGS. 6A and 6B, the CMP barrier layer 69, the upper conductive layer 67, the multiple tunnel junction layer 66, the storage node layer, and the gate insulating layer 53 are successively patterned to form openings exposing predetermined regions of the semiconductor substrate 51. The openings are 2-dimensionally arranged along column and row directions. The exposed semiconductor substrate is etched to form a plurality of trench regions 71. Thus, the trench regions 71 are also 2-dimensionally arranged to define a mesh-shaped active region.

Figure 7A:
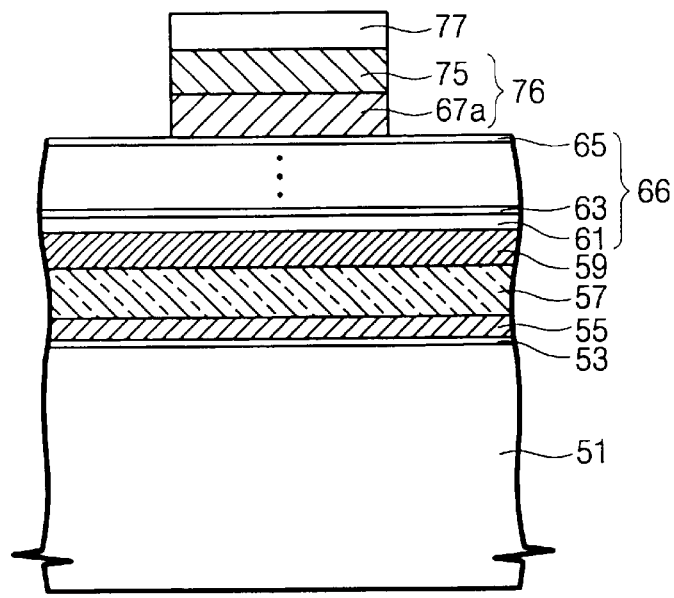
Figure 7B:
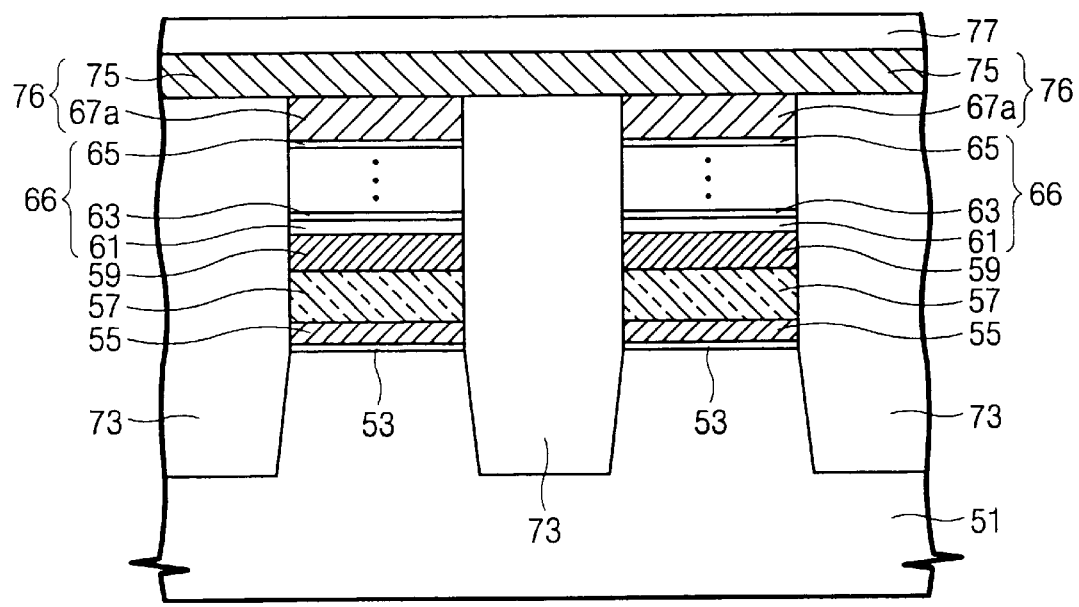

Referring now to FIGS. 7A and 7B, a device isolation layer (not shown) is formed on an entire surface of the semiconductor substrate having the trench regions 71 to fill the trench regions 71. The device isolation layer is etched back down to a top surface of the CMP barrier layer 69 to form a plurality of island-shaped device isolation layer patterns 73 filling the trench regions 71. Consequently, the device isolation layer patterns 73 are also 2-dimensionally arrange along the row and column directions. The process for etching-back the device isolation layer is preferably performed by a CMP technique. The CMP barrier layer 69 is then removed to expose the upper conductive layer 67.

An interconnection layer and a capping insulating layer are sequentially formed on an entire surface of a resultant structure where the upper conductive layer 67 is exposed. The interconnection layer is preferably made of metal, polycide or doped silicon. The capping insulating layer is preferably made of silicon oxide or silicon nitride. The capping insulating layer, the interconnection layer, and the upper conductive layer 67 are successively patterned to form a plurality of capping insulating layer patterns 77 which are parallel to the column direction and a plurality of data lines 76 thereunder.

Each of the data lines 76 covers the device isolation layer patterns 73 located on the line that is parallel to the column direction. Additionally, each of the data lines 76 includes an interconnection line 75 located under the capping insulating layer pattern 77 and upper conductive layer patterns 67a interposed between the interconnection liner 75 and the multiple tunnel junction layer 66. When the interconnection layer is formed of a doped silicon layer or a polycide layer, a process for forming the upper conductive layer 67 may be omitted.

Figure 8A:
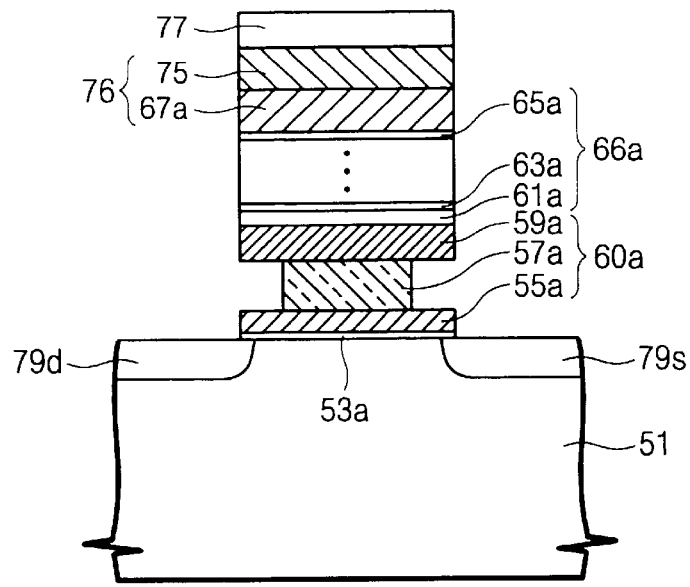
Figure 8B:
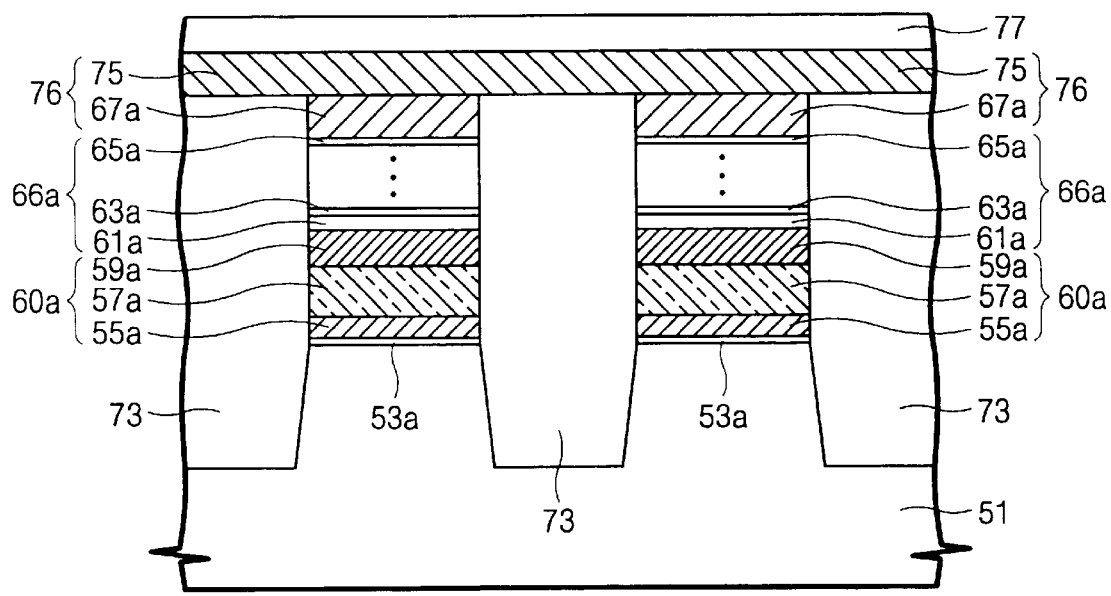

Referring now to FIGS. 8A and 8B, the multiple tunnel junction layer 66 between the data lines 76 is selectively etched to form a plurality of multiple tunnel junction layer patterns 66a in regions between the device isolation layer patterns 73 located under the respective data lines 76. As a result, each of the multiple tunnel junction layer patterns 66a includes a semiconductor layer pattern 61a and a tunnel insulating layer pattern 63a that are alternately and repeatedly stacked. The storage node layer and the gate insulating layer 53 between the data lines 76 are successively etched to form storage node patterns under the multiple tunnel junction layer patterns 66a as well as gate insulating layer patterns 53a under the storage node patterns. Thus, each of the storage node patterns includes a first conductive layer pattern 55a, a second conductive layer pattern 57a, and a third conductive layer pattern 59a that are sequentially stacked.

The second conductive layer patterns 57a are selectively and isotropically etched to form storage nodes 60a having sidewalls with undercut regions. As a result, each of the storage nodes 60a includes the first and third conductive layer patterns 55a and 59a and the isotropically etched second conductive layer pattern 57a interposed therebetween. It is therefore possible to increase the area of both sidewalls of the respective storage nodes 60a, which will later be covered by a wordline.

A process for isotropically etching the second conductive layer pattern 57a may be performed using a wet etch technique or a dry etch technique. For example, if the first and third conductive layers 55 and 59 are made of silicon and the second conductive layer 57 is made of silicon germanium (SiGe), the wet etch technique preferably uses a mixture of deionized (DI) water, hydrogen peroxide ($H_2O_2$), and ammonium hydroxide ($NH_4OH$) or a mixture of DI water, $H_2O_2$, and hydrofluoric acid. The dry etch technique may use oxygen as a main process gas.

As a result, when viewed from a cross-sectional view parallel to a direction that crosses the data lines 76, the width of the second conductive layer pattern 57a is smaller than the widths of the first and third conductive layer patterns 55a and 59a.

Impurities are then implanted into the semiconductor substrate 51 between the data lines 76, forming a plurality of parallel conductive regions, i.e., first and second conductive regions 79d and 79s, respectively. Preferably, first and second conductive regions 79d and 79s are formed using a tilted ion implantation process so that edges of the storage node 60a overlap the first and second conductive regions 79d and 79s.

Figure 9A:
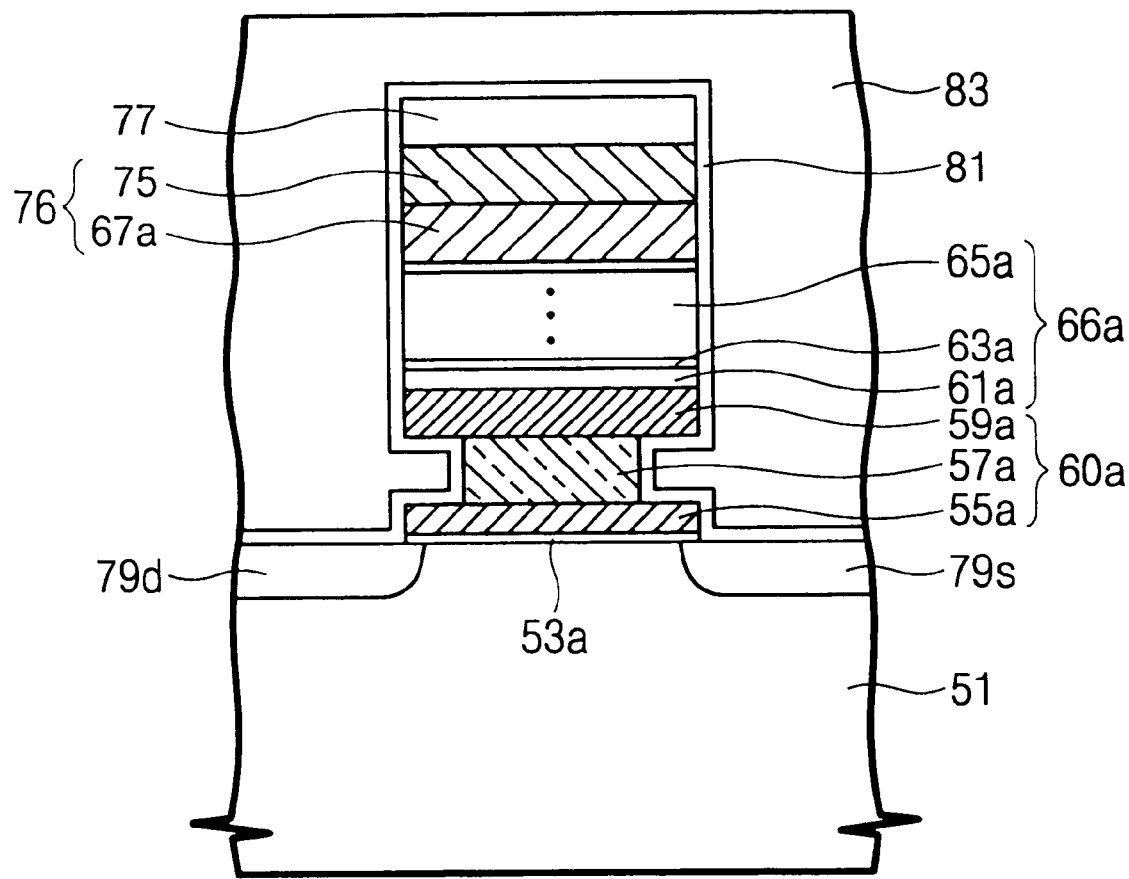
Figure 9B:
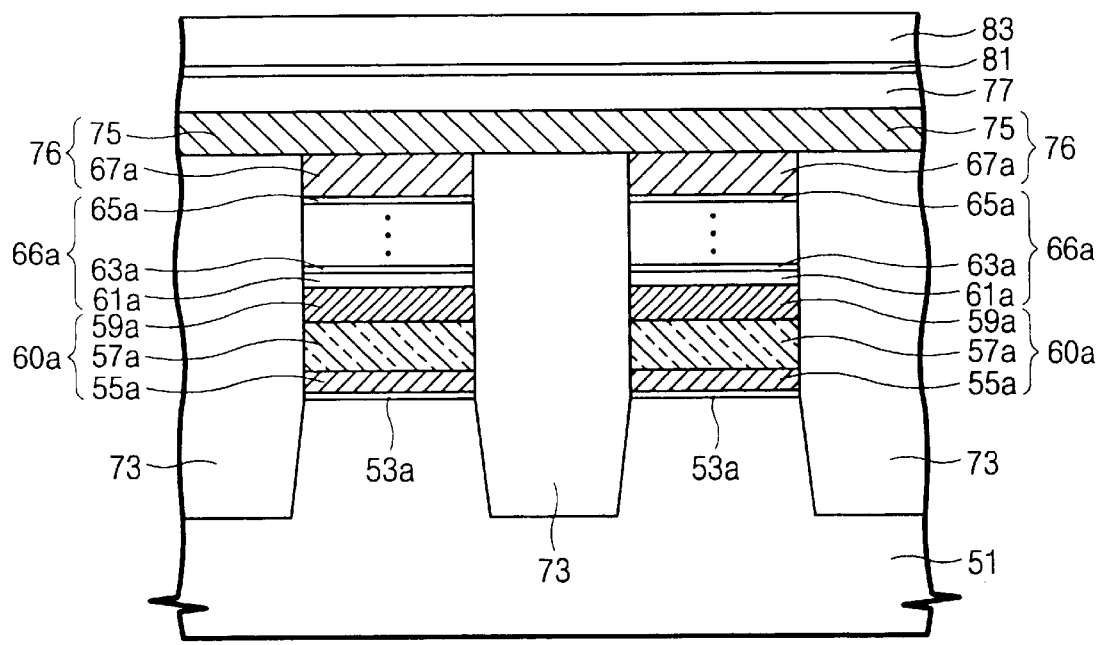

Referring now to FIGS. 9A and 9B, an inter-gate insulating film 81 is conformally formed on an entire surface of a resultant structure where the first and second conductive regions 79d and 79s are formed. The inter-gate insulating film 81 may be made of silicon oxide, silicon nitride or a combination thereof. An etch-stop layer (not shown), e.g., a silicon nitride layer, may additionally be formed on the inter-gate insulating film 81. An interlayer insulating film 83 is then formed on an entire surface of a semiconductor substrate having the inter-gate insulating film 81 and the etch-stop layer.

Figure 10A:
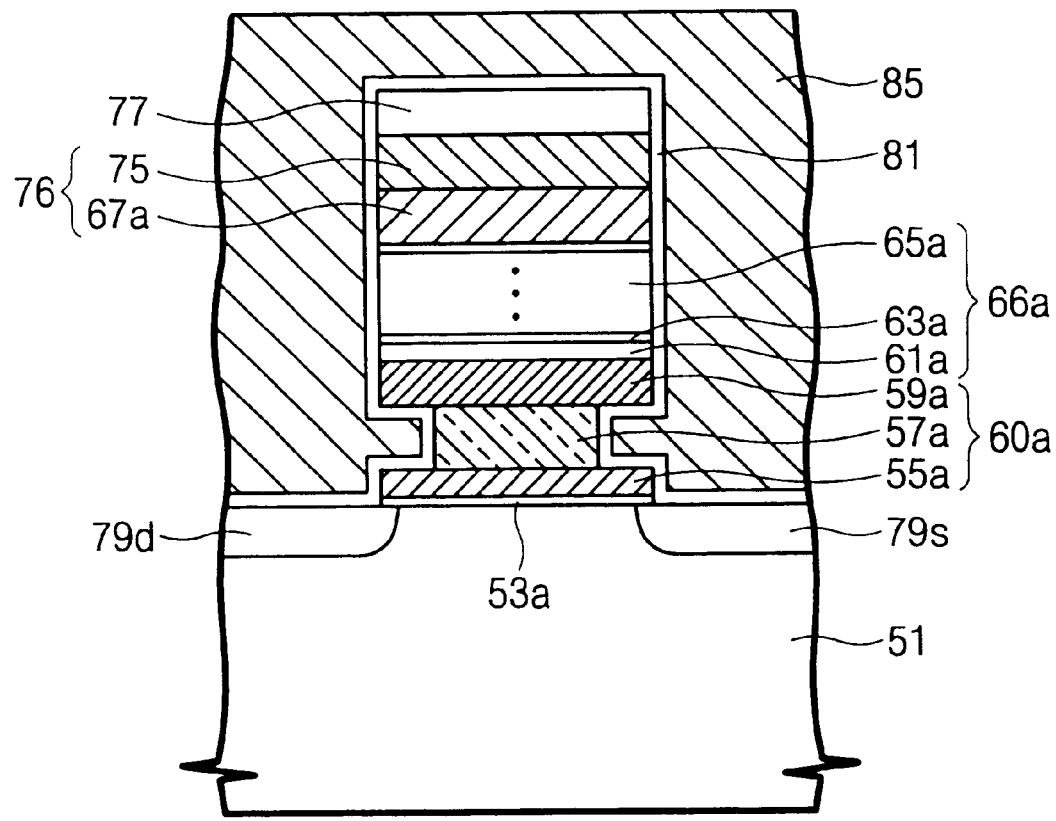
Figure 10B:
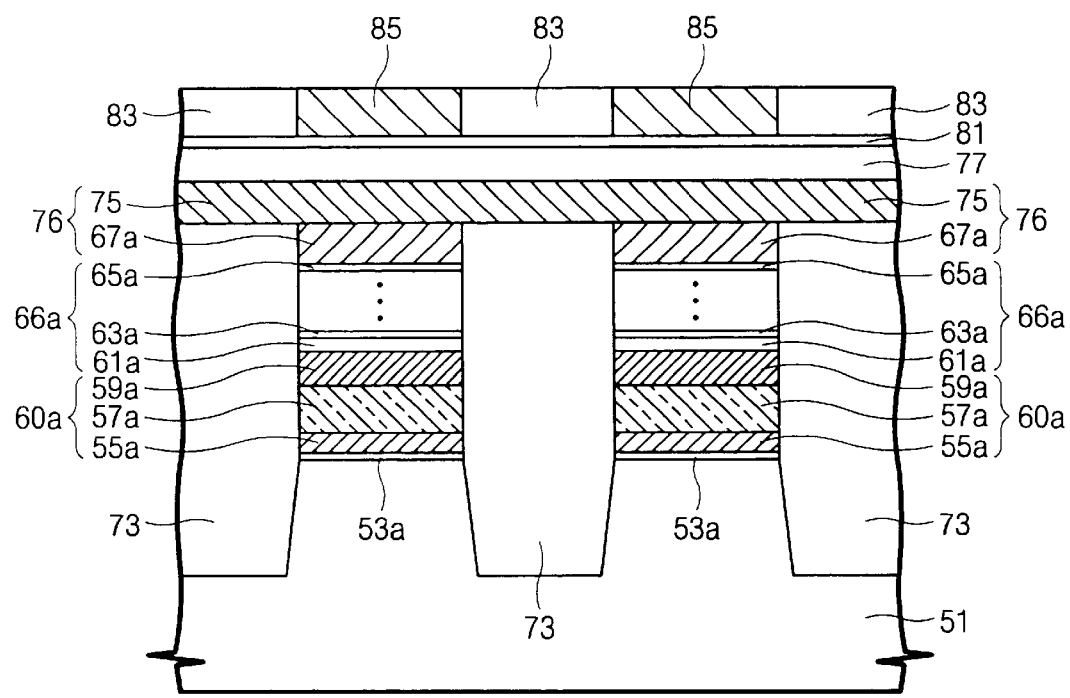

Referring now to FIGS. 10A and 10B, the interlayer insulating film 83 is patterned down to a top surface of the etch-stop layer to form a plurality of grooves crossing over the data lines 76. The exposed etch-stop layer is then etched to expose the inter-gate insulating film 81. A conventional damascene process is carried out in the grooves to form a plurality of wordlines 85. Each of the wordlines 85 covers both sidewalls of the storage nodes 60a and the multiple tunnel junction layer patterns 66a. As a result, an overlapping area between each of the wordlines 85 and each of the storage nodes 60a may be maximized.

In another embodiment of the present invention, to further maximize the overlapping area between a wordline and a storage node, the storage node is formed by alternately and repeatedly stacking the first and the second conductive layer patterns on the channel region between the first and second conductive regions. The etch rate of the first conductive layer is higher than the etch rate of the second conductive layer. This feature results in a multiple number of undercut regions in the storage node. Hence, the overlapping area between a wordline and a storage node may be further maximized by this approach.

In summary, an undercut region is formed on both sidewalls of a storage node to maximize an overlapping area between a wordline and a storage node. Thus, a read voltage is reduced to realize a high-performance semiconductor memory device.

Additional advantages and modifications will readily occur to those of ordinary skill in the art. Therefore, the present invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A method of fabricating a semiconductor memory device comprising:

forming a plurality of trench regions 2-dimensionally arranged along row and column directions at predetermined regions of a semiconductor substrate to define a mesh-shaped active region, as well as a gate insulating layer, a storage node layer, a multiple tunnel junction layer, and an upper conductive layer, which are sequentially stacked on the mesh-shaped active region, wherein the storage node layer is formed by sequentially stacking at least two conductive layers having different etch rates;

forming a plurality of island-shaped device isolation layer patterns filling the trench regions;

forming an interconnection layer covering the upper conductive layer and the device isolation layer patterns;

successively patterning the interconnection layer, the upper conductive layer, the multiple tunnel junction layer, the storage node layer, and the gate insulating layer to form a plurality of data lines which are parallel to the column direction, as well as a gate insulating layer pattern, a storage node pattern, a multiple tunnel junction layer pattern, and an upper conductive layer pattern which are sequentially stacked in regions between the device isolation layers under each of the data lines;

etching the storage node patterns to form storage nodes having undercut regions at both sidewalls of the storage node patterns;

conformally forming an inter-gate insulating film on an entire surface of a resultant structure having the storage nodes; and forming a plurality of parallel wordlines crossing over the data lines on the inter-gate insulating film, each of the wordlines covering both sidewalls of the storage nodes and both sidewalls of the multiple tunnel junction layer patterns.

2. The method of fabricating a semiconductor memory device as claimed in claim 1, wherein the storage node layer is formed by alternately and repeatedly stacking first and second conductive layers, wherein an etch rate of the first conductive layer is higher than an etch rate of the second conductive layer.

3. The method of fabricating a semiconductor memory device as claimed in claim 2, wherein the first conductive layer is made of silicon and the second conductive layer is made of silicon germanium (SiGe).

4. The method of fabricating a semiconductor memory device as claimed in claim 1, wherein the storage node patterns are etched by a selective and isotropic wet etch technique or a dry etch technique.

5. The method of fabricating a semiconductor memory device as claimed in claim 4, wherein the dry etch technique uses oxygen as a main process gas.

6. The method of fabricating a semiconductor memory device as claimed in claim 4, wherein the wet etch technique uses a mixture of deionized (DI) water, hydrogen peroxide ($H_2O_2$), and ammonium hydroxide ($NH_4OH$) or a mixture of DI water, $H_2O_2$, and hydrofluoric acid.

7. The method of fabricating a semiconductor memory device as claimed in claim 1, further comprising, after forming the storage nodes, implanting impurities into the active region between the data lines to form a plurality of conductive regions which are parallel to the data lines.

8. The method of fabricating a semiconductor memory device as claimed in claim 7, wherein the plurality of conductive regions are formed using a tilted ion implantation process so that edges of the storage node overlap the plurality of conductive regions.

9. The method of fabricating a semiconductor memory device as claimed in claim 1, wherein the multiple tunnel junction layer is formed by alternately and repeatedly stacking a semiconductor layer and a tunnel insulating layer.

10. The method of fabricating a semiconductor memory device as claimed in claim 9, wherein the semiconductor layers in the multiple tunnel junction layer are made of silicon.

11. The method of fabricating a semiconductor memory device as claimed in claim 9, wherein the insulating layers in the multiple tunnel junction layer are made of silicon nitride, silicon oxynitride or silicon oxide.

12. The method of fabricating a semiconductor memory device as claimed in claim 1, wherein the upper conductive layer is made of doped silicon.

13. The method of fabricating a semiconductor memory device as claimed in claim 1, wherein the interconnection layer is made of a metal, polycide or doped silicon.

14. The method of fabricating a semiconductor memory device as claimed in claim 1, wherein the inter-gate insulating film is made of silicon oxide, silicon nitride or their combination.

15. The method of fabricating a semiconductor memory device as claimed in claim 1, wherein the storage node layer is formed by sequentially stacking a first conductive layer pattern, a second conductive layer pattern, and a third conductive layer pattern wherein an etch rate of the second conductive layer is higher than the etch rates of the first and third conductive layers.

* * * * *